(12) United States Patent
Karasudani

(10) Patent No.: US 6,861,910 B2
(45) Date of Patent: Mar. 1, 2005

(54) MULTISTAGE AMPLIFIER AND INTEGRATED CIRCUIT

(75) Inventor: Munehiro Karasudani, Tokyo (JP)

(73) Assignee: Niigata Seimitsu Co., LTD, Niigata (JP)

(*) Notice: Subject to any disclaimer, the term of this patent is extended or adjusted under 35 U.S.C. 154(b) by 0 days.

(21) Appl. No.: 10/707,884

(22) Filed: Jan. 20, 2004

(65) Prior Publication Data

US 2004/0124928 A1 Jul. 1, 2004

Related U.S. Application Data

(63) Continuation of application No. PCT/JP02/06975, filed on Jul. 10, 2002.

(30) Foreign Application Priority Data

Jul. 23, 2001 (JP) .......................................... 2001-220880

(51) Int. Cl.[7] ................................................ H03F 3/04
(52) U.S. Cl. ...................................... 330/311; 330/150
(58) Field of Search ................................ 330/310, 311, 330/150, 98, 152

(56) References Cited

U.S. PATENT DOCUMENTS

| | | | | |
|---|---|---|---|---|
| 4,237,426 A | * | 12/1980 | Sueyoshi | 330/296 |
| 4,268,797 A | * | 5/1981 | Buck et al. | 330/277 |
| 4,935,705 A | * | 6/1990 | Estanislao et al. | 330/296 |
| 5,982,236 A | * | 11/1999 | Ishikawa et al. | 330/296 |

FOREIGN PATENT DOCUMENTS

| | | |
|---|---|---|
| JP | 45-24246 Y1 | 9/1970 |
| JP | 62-8600 Y2 | 2/1987 |
| JP | 10-294828 | 11/1998 |
| JP | 2002-026664 A2 | 1/2002 |

* cited by examiner

Primary Examiner—Henry Choe
(74) Attorney, Agent, or Firm—Connolly Bove Lodge & Hutz LLP; Larry J. Hume

(57) ABSTRACT

An initial-stage amplifier 1 that deals with microsignals and other amplifiers 2 and 3 separate a power source line, and both separated power source lines 4 and 8 are commonly connected to a power source pad 6. This enables avoidance of the occurrence of a large potential difference between the initial-stage amplifier 1 and other amplifiers 2 and 3 due to differences in currents pulled to the amplifiers 1 to 3, and can prevent the occurrence of noise arising from such potential difference. Also, feedback loops are differentiated by the initial-stage amplifier 1 and other amplifiers 2 and 3. This can also prevent unfavorable effects where a large signal would be fed back from the rear-stage amplifiers 2 and 3 to the initial-stage amplifier 1.

6 Claims, 2 Drawing Sheets

FIG. 1 (CONVENTIONAL)
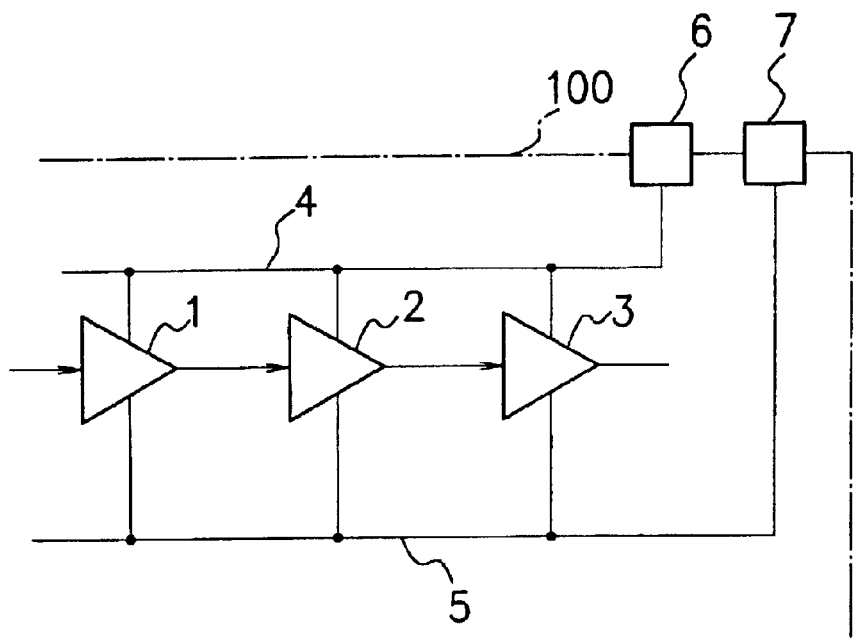

MULTISTAGE AMPLIFIER AND INTEGRATED CIRCUIT

CROSS REFERENCE TO RELATED APPLICATIONS

This Application is a Continuation application claiming benefit under 35 U.S.C. §120 to International Application PCT/JP02/06975 filed on Jul. 10, 2002, and which claims priority from Japanese application 2001-220880 filed on Jul. 23, 2001, the entire contents of each of which are incorporated herein by reference.

BACKGROUND

The present invention relates to a multistage amplifier and integrated circuit. In particular, the present invention is suitable for use for a multistage amplifier that sequentially amplifies signal gains at a plurality of amplification sections in a cascade connection manner, and integrated circuit that is composed of such multistage amplifier or other circuits with large gains.

Normally, a multistage amplifier, where a plurality of amplifiers are constructed in a multistage cascade connection manner and which can obtain high gains, is used in limiter amplifier for an FM radio receiver or Intermediate Frequency (IF) amplifier for an AM radio receiver or the like, so as to obtain larger gains by amplifying input microsignals. Conventionally, ICs where such a multistage amplifier is integrated within a single chip have been also provided.

FIG. 1 is a figure showing a conventional example of an IC chip composed of means of a multistage amplifier. As shown in FIG. 1, the multistage amplifier is composed of n amplifiers 1, 2, 3 (in this example, n=3), which are constructed in a cascade connection manner from an input side to an output side. All amplifiers 1 to 3 are commonly connected to the same power source line 4, and are connected to a power source VDD outside the IC chip 100, via a power source pad 6. Additionally, all amplifiers 1 to 3 are commonly connected to the same ground line 5, and are grounded outside the IC chip 100 via a ground pad 7. All amplifiers 1 to 3 perform amplification operations using the external power source VDD.

In the multistage amplifier structured as mentioned above, a microsignal inputted to a first-stage amplifier 1 is amplified by such amplifier 1 at a predominated level and outputted. The signal amplified and outputted here is inputted to a second-stage amplifier 2, and is further amplified and outputted by such amplifier 2.

In the same manner hereinafter, a third-stage amplifier 3 further amplifies the signal. Herewith, the amplitude of the input microsignal inputted to the first-stage amplifier 1 becomes gradually larger as passes to rear stages, and the signal amplified at the predominated level is finally outputted from the third-stage amplifier 3.

Normally, high gain about 80 dB is required for a limiter amplifier for an FM radio receiver or IF amplifier for an AM radio receiver or the like. An input microsignal on the μV (microvolt) order passes through such multistage amplifier. This enables such signal to be amplified to the mV (millivolt) order.

As shown in FIG. 1, in a conventional multistage amplifier, one power source line 4 is commonly connected to at each stage, and is wired over to the power source pad 6. Thus, differences occur to currents that are sequentially pulled to amplifiers 1 to 3 at each stage from the external power source VDD. At this time, since common impedance occurs on the power source line 4, a potential difference occurs to the power source supplied to the amplifiers 1 to 3 at each stage. Especially, when a circuit with large area such as an amplifier is constructed in a cascade connection manner, the distance from the first-stage amplifier 1 to the power sourced pad 6 becomes long, and a large potential difference occurs due to high impedance. And this potential difference causes a problem as noise.

Additionally, signals are fed back from the rear-stage amplifiers to the early-stage amplifiers through signal feedback loops that are formed by the internal circuit of the amplifiers 1 to 3, the power source line 4 and ground line 5. Therefore, interference between normal amplified signals and feedback signals causes instability of amplification operations, the performance of a multistage amplifier falls. Also, when signals on the mV order at the final-stage amplifier 3 are fed back to the initial-stage amplifier 1, which deals with microsignals on the μV order, oscillations occur if the total loop gain is large.

The present invention is accomplished in order to solve such problems. When a plurality of amplifiers are constructed in a cascade connection manner and the like, in a circuit that has large gains and whose area is large, the purpose of the invention is to prevent noise or oscillations from occurring on the power source line, and to cause such circuit to operate in a stable manner.

BRIEF SUMMARY

A multistage amplifier of the present invention comprises a plurality of amplifiers that are constructed in a cascade connection manner so as to amplify an input signal from a previous stage and output the amplified signal to a following stage, and a power source line connected to the plurality of amplifiers. The power source line has a first power source line connected to at least the initial-stage amplifier from among the plurality of amplifiers, and a second power source line commonly connected to the remaining amplifiers except for at least the initial-stage amplifier.

In another aspect of the present invention, a bypass condenser is arranged between the second power source line and a ground line.

In another aspect of the present invention, a multistage amplifier comprises a plurality of amplifiers that are constructed in a cascade connection manner so as to amplify an input signal from a previous stage and output the amplified signal to a following stage, and a ground line connected to the plurality of amplifiers. The ground line has a first ground line connected to at least the initial-stage amplifier from among the plurality of amplifiers, and a second ground line commonly connected to the remaining amplifiers except for at least the initial-stage amplifier.

In another aspect of the present invention, a multistage amplifier comprises a plurality of amplifiers that are constructed in a cascade connection manner so as to amplify an input signal from a previous stage and output the amplified signal to a following stage, and a ground line connected to the plurality of amplifiers. Substrates held by the plurality of amplifiers are each connected to the ground line.

In another aspect of the present invention, a multistage amplifier comprises a plurality of amplifiers that are constructed in a cascade connection manner so as to amplify an input signal from a previous stage and output the amplified signal to a following stage, and a plurality of power source lines that are individually connected to the plurality of amplifiers.

Also, an integrated circuit of the present invention comprises a plurality of amplifiers that are constructed in a cascade connection manner so as to amplify an input signal from a previous stage and output the amplified signal to a following stage, a power source line connected to the plurality of amplifiers, and a power source pad connected to the power source line. The power source line has a first power source line connected between at least the initial-stage amplifier from among the plurality of amplifiers and the power source pad, and a second power source line commonly connected between the remaining amplifiers except for at least the initial-stage amplifier and the power source pad.

In another aspect of the present invention, a bypass condenser is arranged between the second power source line and a ground line.

In another aspect of the present invention, an integrated circuit comprises a plurality of amplifiers that are constructed in a cascade connection manner so as to amplify an input signal from a previous stage and output the amplified signal to a following stage, a ground line connected to the plurality of amplifiers, and a ground pad connected to the ground line. The ground line has a first ground line connected between at least the initial-stage amplifier from among the plurality of amplifiers and the ground pad, and a second power source line commonly connected between the remaining amplifiers except for at least the initial-stage amplifier and the ground pad.

In another aspect of the present invention, an integrated circuit comprises a plurality of amplifiers that are constructed in a cascade connection manner so as to amplify an input signal from a previous stage and output the amplified signal to a following stage, a ground line connected to the plurality of amplifiers, and a ground pad connected to the ground line. Substrates held by the plurality of amplifiers are each connected to the ground line.

In another aspect of the present invention, an integrated circuit comprises a plurality of amplifiers that are constructed in a cascade connection manner so as to amplify an input signal from a previous stage and output the amplified signal to a following stage, a plurality of power source lines individually connected to the plurality of amplifiers, and a power source pad commonly connected to the plurality of power source lines.

In another aspect of the present invention, an integrated circuit comprises a plurality of processing circuits that are constructed in a cascade connection manner so as to process an input signal from a previous stage and output the processed signal to a following stage, a first power source line connected to at least the initial-stage processing circuit from among the plurality of processing circuits, a second source line commonly connected to the remaining processing circuits except for at least the initial-stage processing circuit, and a power source pad commonly connected to the first and second power source lines.

According to the present invention structured as above, the same power voltage can be supplied to at least the initial-stage amplifier and other amplifiers via different power source lines. Thus, no large potential difference occurs between the initial-stage amplifier and other amplifiers due to differences in currents pulled in each amplifier, and the occurrence of noises arising from such potential difference can be prevented. Also, since the initial-stage amplifier and other amplifiers differentiate feedback loops of signals, it is possible to prevent unfavorable effects where that signals would be fed back from the rear-stage amplifiers to the initial-stage amplifier.

According to other characteristics of the present invention, even if noises were to occur on the second power source line, such noise would be smoothed out by impedance of such noises and by the bypass condenser arranged between the second power source line and the ground line, and noise level can be reducibly suppressed.

According to other characteristics of the present invention, substrates of a plurality of amplifiers are individually connected to the ground line. Thus, substrates are separated from each other, and coupling between circuits through such substrates can be avoided.

DESCRIPTION OF THE DRAWINGS

FIG. 1 is a diagram showing the structure of an IC chip composed of a conventional multistage amplifier.

DETAILED DESCRIPTION

First Embodiment

Figure 2:
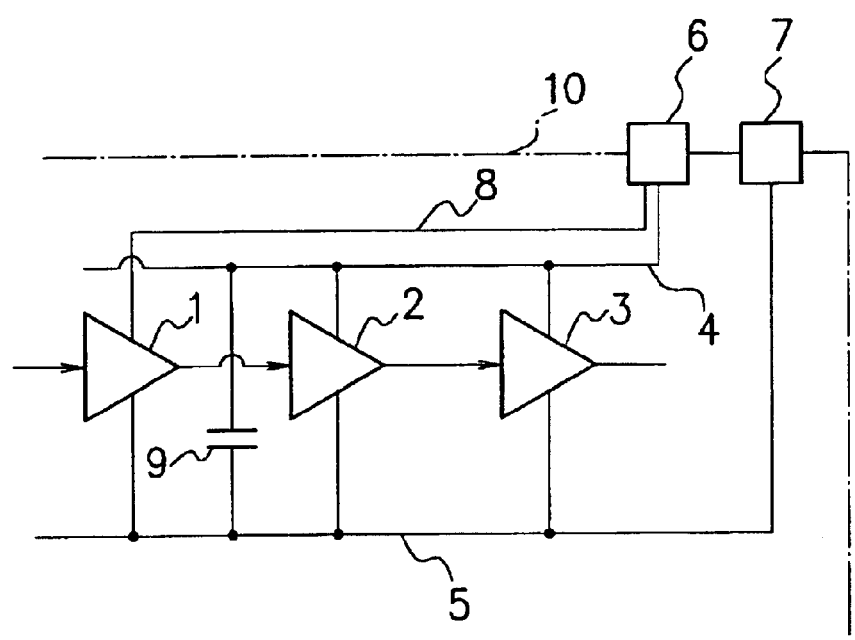
FIG. 2 is a diagram showing the structure of an IC chip composed of the multistage amplifier of the first embodiment.

First, the first embodiment of the present invention is hereinafter explained with reference to the drawing.

FIG. 2 is a diagram showing an example of the structure of the IC chip 10 composed of the multistage amplifier of this embodiment. As shown in FIG. 2, in the multistage amplifier of this embodiment, n amplifiers 1, 2, 3 (in this example, n=3) are constructed in a cascade connection manner from an input side to an output side.

From among a plurality of the amplifiers 1 to 3, a first-stage amplifier 1 is connected to a first power source line 8, and is connected to a power source VDD (not illustrated) outside the IC chip 10 via a power source pad 6. Also, two amplifiers 2 and 3, except for the first-stage amplifier 1, are commonly connected to the same second power source line 4, and are connected to the power source VDD outside the IC chip 10 via the power source pad 6. All amplifiers 1 to 3 perform amplification operations using the external power source VDD.

It is possible to connect the first power source line 8 and the second power source line 4 to a different power source pad. However, in this embodiment, such power source lines 4 and 8 are commonly connected to one power source pad 6 as shown in FIG. 2. This enables increases of pads to be avoided, and guarantees that the same power voltage can be supplied to the first power source line 8 and the second power source line 4.

Also, all amplifiers 1 to 3 are commonly connected to the same ground line 5, and are grounded outside the IC chip 10 via the ground pad 7. Additionally, a bypass condenser 9 is arranged between the second power source line 4 and the ground line 5. The capacity of this bypass condenser 9 is roughly a few picofarads (pF).

As stated above, the characteristics of the IC chip of this embodiment are that the power source line is separated by the first-stage amplifier 1, which deals with the smallest signal, and the amplifiers 2 and 3, which deal with the amplified signals at a larger level, and both separated power source lines 8 and 4 are wired to the common power source pad 6.

This enables the avoidance of the occurrence of a large potential difference between the first-stage amplifier 1 and other amplifiers 2 and 3, and enables the occurrence of noise arising from such potential difference to be effectively prevented. Also, since feedback loops are differentiated by the first-stage amplifier 1 and other amplifiers 2 and 3, no signals are fed back from the rear-stage amplifiers 2 and 3 to the early-stage amplifier 1. Thus, this enables avoidance of unfavorable effects where interference between normal amplified signals and feedback signals would cause limitation of gains for amplification. In addition, this can also prevent unfavorable effects where a large signal on the mV order would be fed back to the first-stage, which deals with microsignals with the $\mu$V order, and be oscillated. Therefore, stability of operations regarding the multistage amplifier can be expected.

Furthermore, in this embodiment, the bypass condenser 9 is arranged at the second power source line 4 to which a plurality of amplifiers 2 and 3 are commonly connected. Thus, even though noises occur due to impedance on the power source line 4, such impedance and bypass condenser 9 can smooth out and minimize noises.

In addition, in the embodiment above, two amplifiers 2 and 3 are commonly connected to one power source line 4. However, when the level of signals dealt by the amplifier 2 is not sufficiently large and such signal may be likely to oscillate due to a feedback signal from the rear-stage amplifier 3, the power source line may also be separated for such two amplifiers 2 and 3, and separated power source lines may be wired to the common power source pad 6.

For example, a plurality of power source lines may be individually connected to a plurality of amplifiers 1 to 3, and such plurality of power source lines may be connected to the common power source pad 6. Or, the first-stage 1 and the second-stage amplifiers 1 and 2 may be connected to a common power source line, and the power source line may be separated by the amplifiers 1 and 2 up to the second-stage and the third-stage amplifier 3.

Also, in the embodiment above, the power source line is separated. However, the ground line or both the power source line and the ground line may be separated. For example, the ground line 5 shown in FIG. 2 may be separated from the first ground line, which is connected between the first-stage amplifier and the ground pad 7, and the second ground line, which is commonly connected between other amplifiers 2 and 3 other than the first-stage amplifier 1 and the ground pad 7.

Additionally, in the embodiment above, the multistage amplifier is explained. It is also possible to voluntarily apply such embodiment to a circuit that amplifies gains of microsignals. Also, not limited to the circuit that amplifies gains of signals, in the case of an integrated circuit that is equipped with a plurality of processing circuits that process input signals from the front stage and output them to a following stage and the like, and that has large total gains and whose area is large (the distance form the pad becomes long), this prevention can be also applied thereto correspondingly.

Second Embodiment

Next, the second embodiment of the present invention is hereinafter explained based on the drawing.

Figure 3:
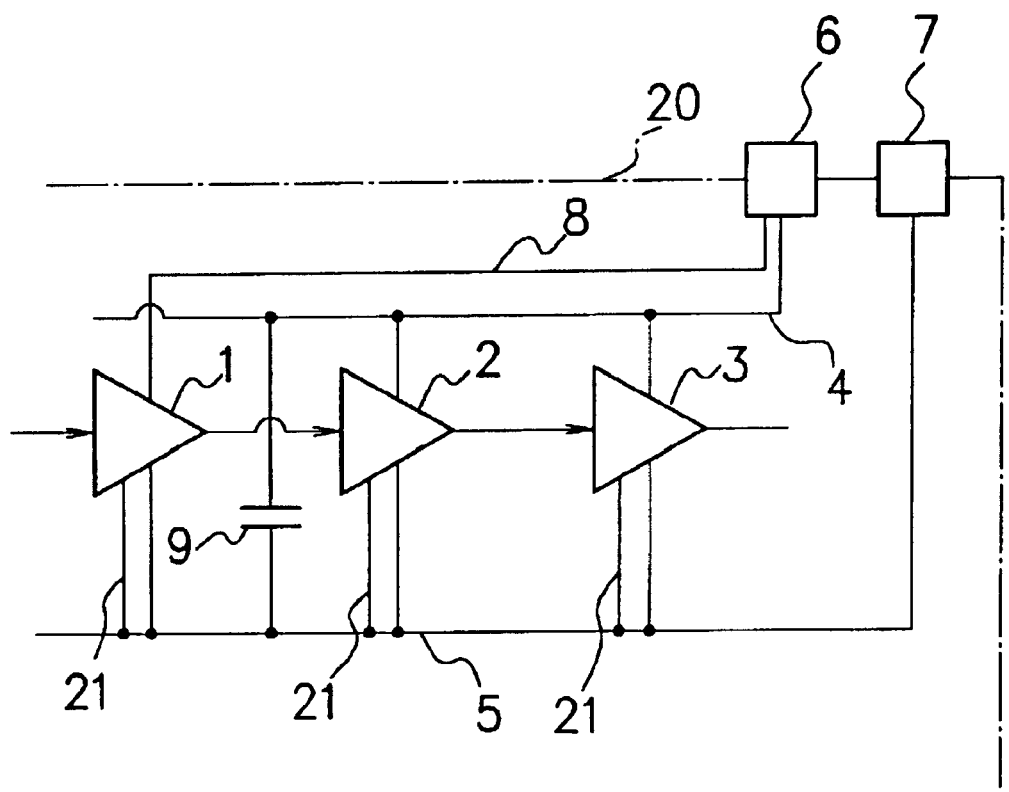
FIG. 3 is a diagram showing the structure of an IC chip composed of the multistage amplifier of the second embodiment.

FIG. 3 is a diagram showing an example of the structure of the IC chip 20 composed of the multistage amplifier according to the second embodiment. In addition, since items with the same notation as those shown in FIG. 2 have the same functions thereas, overlapping explanations are omitted here.

In the second embodiment shown in FIG. 3, as shown in notation 21, substrates (well regions formed on the MOSFET silicon substrate) held by a plurality of the amplifiers 1 to 3 are each connected to the ground 5.

Conventionally, in the same manner as the power source line 4 and ground line 5 shown in FIG. 1, substrates of all amplifiers 1 to 3 have been commonly connected to one substrate line (not illustrated) by being gathered together, and such gathered substrates have been connected to a pad exclusively used for substrate (not illustrated). This can draw up noise components that are leaked to the substrate by the aluminum wires of the substrate line, and discharge them outside the chip from the exclusive substrate pad.

However, in such case, in addition to the power source pad 6 or the ground pad 7, it is necessary to arrange a pad exclusively for the substrate. To the contrary, this embodiment does not require arranging a pad exclusively for the substrate, and enables miniaturization of the area of the IC chip 20 to such an extent.

In addition, connecting the common substrate line to the ground pad 7 enables omission of the pad exclusively used for the substrate. However, in this embodiment, no common substrate line itself is arranged, and substrates of all amplifiers 1 to 3 are individually connected to the ground line 5, and are connected to the ground pad 7 via the ground line 5. This can prevent coupling among the substrates of the amplifiers 1 to 3, and can suppress so-called coupling noises.

Also, even in the second embodiment, various variations stated in the first embodiment can be applicable. For example, the ground line may be separated by the first-stage amplifier 1 and other amplifiers 2 and 3, and each separated ground line by be connected to substrates.

The multistage amplifier and integrated circuit of the embodiments described above can be applicable to electric apparatuses that are equipped with functions for receiving and processing high frequency signals (RF signals), such as AM or FM radio receivers, televisions, cellular phones, codeless phones, Bluetooth devices as a short-distance wireless data communication technology, wireless LANs, car navigation systems, game machines with communication facilities, and the like.

The embodiments explained above have shown only one example of the possible incarnations upon implementing the present invention. This should not cause the technical scope of the present invention to be restrictively interpreted. That is to say, the present invention can be implemented in various forms, without deviating from the spirit or the main characteristics thereof.

As explained above, regarding the present invention, the power source line is separated by at least the first-stage amplifier and other amplifiers, and the various separated power source lines are wired to the power source pad. This enables the avoidance of the occurrence of a large potential difference between the first-stage amplifier and other amplifiers, and can effectively prevent occurrence of noise arising from such potential difference.

Also, feedback loops of the signals can be differentiated by the first-stage amplifier and other amplifiers, and unfavorable effects where signals would be fed back from the rear-stage amplifiers to the initial-stage amplifier can be prevented. This enables avoidance of unfavorable effects where normal amplified signals and feedback signals would interfere and restrict gains of amplification. Also, this can also prevent unfavorable effects where a large signal on the mV order would be fed back to the initial-stage, which deals with microsignals with the $\mu$V order, and be oscillated. Thus, stability of operations can be brought to the circuit.

According to another aspect of the present invention, even if noises occur on the second power source line, noises can be smoothed out and reducibly suppressed by the impedance of such noises, and by a bypass condenser that is established between the second power source line and the ground line.

According to another aspect of the present invention, since the substrates of a plurality of amplifiers are individually connected to the ground line, substrates can be separated. This can avoid coupling between the circuits through such substrates, and can suppress so-called coupling noises. Also, since it is not necessary to arrange a pad exclusively for substrates, the area of the chip can be also miniaturized.

INDUSTRIAL APPLICABILITY

The present invention is useful in that regarding the circuit which has large gains, and whose area of circuit is large, such as a case where a plurality of amplifiers are constructed in a cascade connection manner, noises or oscillations occurring on the power source line can be prevented, and the circuit can be stably operated.

What is claimed is:

1. A multistage amplifier, comprising:
   a plurality of amplifiers that are constructed in a cascade connection manner so as to amplify an input signal from a previous stage and output the amplified signal to a following stage; and
   a ground line connected to said plurality of amplifiers;
   wherein substrates held by said plurality or amplifiers are each individually connected to said ground line.

2. A multistage amplifier, comprising:
   a plurality of amplifiers that are constructed in a cascade connection manner so as to amplify an input signal from a previous stage and output the amplified signal to a following stage;
   a power source line connected to said plurality of amplifiers; and
   a ground line connected to said plurality of amplifiers;
   wherein said power source line has a first power source line connected to at least the initial-stage amplifier from among said plurality of amplifiers, and a second power source line commonly connected to the remaining amplifiers except for at least said initial-stage amplifier;
   wherein substrates held by said plurality of amplifiers are each individually connected to said ground line.

3. The multistage amplifier according to claim 2, wherein said ground line has a first ground line connected to at least said initial-stage amplifier, and a second ground line commonly connected so the remaining amplifiers except for at least said initial-stage amplifier.

4. An integrated circuit, comprising:
   a plurality of amplifiers that are constructed in a cascade connection manner so as to amplify an input signal from a previous stage and output the amplified signal to a following stage;
   a ground line connected to said plurality of amplifiers; and
   a ground pad connected to said ground line;
   wherein substrates held by said plurality of amplifiers are each individually connected to said ground line.

5. An integrated circuit, comprising:
   a plurality of amplifiers that are constructed in a cascade connection manner so as to amplify an input signal from a previous stage and output the amplified signal to a following stage;
   a power source line connected to said plurality of amplifiers;
   a ground line connected to said plurality of amplifiers;
   a power source pad connected to said power source line; and
   a ground pad connected to said ground line;
   wherein said power source line has a first power source line connected between at least the initial-stage amplifier from among said plurality of amplifiers and said power source pad, and a second power source line commonly connected between the remaining amplifiers except for at least said initial-stage amplifier and said power source pad;
   wherein substrates held by said plurality of amplifiers are each individually connected to said around line.

6. The integrated circuit according to claim 5, wherein said ground line has a first ground line connected between at feast said initial-stage amplifier and said ground pad, and a second ground line commonly connected between the remaining amplifiers except for at least said initial-stage amplifier and said ground pad.

* * * * *